United States Patent
Topliss (10) Patent No.: US 8,711,495 B2
(45) Date of Patent: Apr. 29, 2014

(54) MEMS AUTOFOCUS ACTUATOR

(71) Applicant: Apple Inc., Cupertino, CA (US)

(72) Inventor: Richard J. Topliss, Campbell, CA (US)

(73) Assignee: Apple Inc., Cupertino, CA (US)

(*) Notice: Subject to any disclaimer, the term of this patent is extended or adjusted under 35 U.S.C. 154(b) by 11 days.

(21) Appl. No.: 13/632,965

(22) Filed: Oct. 1, 2012

(65) Prior Publication Data

US 2014/0092492 A1 Apr. 3, 2014

(51) Int. Cl.
*G02B 7/02* (2006.01)
*G02B 26/08* (2006.01)

(52) U.S. Cl.
USPC ............ 359/823; 359/824; 359/819; 359/298

(58) Field of Classification Search
USPC .................. 359/290–298, 811–830
See application file for complete search history.

(56) References Cited

U.S. PATENT DOCUMENTS

| | | |
|---|---|---|
| 6,914,635 B2 | 7/2005 | Ostergard |
| 7,359,131 B1 | 4/2008 | Gutierrez et al. |
| 7,583,006 B2 | 9/2009 | Calvet et al. |
| 7,697,831 B1 | 4/2010 | Tsai et al. |
| 7,729,603 B2 | 6/2010 | Xu et al. |
| 7,769,281 B1 | 8/2010 | Gutierrez |
| 8,004,780 B2 * | 8/2011 | Gutierrez et al. ............. 359/824 |
| 8,154,650 B2 | 4/2012 | Tsai |
| 2010/0208091 A1 | 8/2010 | Chang |
| 2011/0080627 A1 | 4/2011 | He et al. |

FOREIGN PATENT DOCUMENTS

CN 1740843 3/2006

OTHER PUBLICATIONS

Li, P., et al., "Comb-drive tracking and focusing lens actuators integrated on a silicon-on-insulator wafer", Optics Express, vol. 20, No. 1, (Jan. 2, 2012), 627-634, January.
Wu, M., et al., "Development of tracking and focusing micro actuators for dual-stage optical pick-up head", Journal of Optics A: Pure and Applied Optics, 8, (2006), S323-S329, January.

* cited by examiner

*Primary Examiner* — Mohammed Hasan
(74) *Attorney, Agent, or Firm* — Blakely, Sokoloff, Taylor & Zafman LLP (57) ABSTRACT

A micro-electro-mechanical systems (MEMS) autofocus actuator having a support member for supporting a lens element, the support member including a stationary portion and a movable portion, the movable portion attached to the stationary portion by a movable support beam. An electrostatic drive member is attached to the stationary portion and the movable portion to drive movement of the movable portion with respect to the stationary portion. A lens holder is suspended within the support member by a resilient arm member attached to the movable portion and a deflection beam attached to the stationary portion so that in a non-actuated state, the lens element is in a first focal position that is substantially out-of-plane with respect to the stationary portion, and in an actuated state, the lens element is in a second focal position, the second focal position being different from the first focal position.

21 Claims, 8 Drawing Sheets

MEMS AUTOFOCUS ACTUATOR

FIELD

An embodiment of the invention is directed to a micro-electro-mechanical system (MEMS) autofocus actuator for a camera module that may be integrated within an electronic device such as a smartphone. Other embodiments are also described and claimed.

BACKGROUND

Miniature cameras are becoming increasing common in mobile electronic devices such as smartphones. There is a constant drive to improve performance of such cameras, whilst ideally maintaining the same envelope. One feature augmentation that is now standard in such miniature cameras is autofocus. The incumbent actuator technology for such cameras is the voice coil motor (VCM). Many other technologies have been proposed over the last few years, with varying strengths and weaknesses and differing degrees of commercial success. The VCM technology has the key advantage of being simple, and therefore being straightforward to design. Whilst there are several disadvantages of VCM, such as high power, and low relative force, their use persists. One technology that has showed promise over the last few years is silicon micro-electro-mechanical systems (MEMS).

The MEMS technology is based around the philosophy of the electrostatic comb drive. The magnitude of actuation movement achievable with such a small-scale silicon device is less than that required to move the whole lens in such miniature cameras. The MEMS technology allows focusing of the camera between the notional infinity object distance and 10 cm focal distance, which is the typical specification for most devices. In addition, the cost of the MEMS actuator is almost entirely proportional to the surface area of silicon per device since MEMS devices are manufactured at the wafer level. As such, current MEMS devices mount a single lens element from the multi-element lens stack typically found in such miniature camera lenses. By choosing a lens element with high optical power, and hence a small relative focal length, the actuation movement is reduced. Since a single lens element is mounted in the actuator, the size of the silicon actuator can also be minimized.

As compared with VCM, the MEMS technology benefits from requiring very little power, a factor that is increasingly important in mobile devices. In addition, owing to the small size and stiff silicon structure, the mechanical resonance is much higher, delivering much faster response speed and focusing time, and also better stability for different camera orientations. There are two key factors, however, that have prevented the MEMS technology from being a practical commercial success. The first is that the actuator has thus far failed to survive the very difficult impact and drop testing that mobile devices require. In addition, moving a single lens element increases the complexity of the lens assembly and means that the actuator assembly and lens assembly are no longer separated, but integrated. This presents manufacturing problems.

SUMMARY

An embodiment of the invention is an autofocus actuator for a camera module that may be integrated within a miniature camera. The actuator may include one or more electrostatic drive members, such as a comb drive, attached to a silicon MEMS structure. The silicon MEMS structure may be fabricated to include a stationary portion and a movable portion that is moved by one or more of the drive members with respect to the stationary portion. A lens holder may be attached to the movable portion of the MEMS structure such that movement of the drive member moves a lens positioned within the lens holder in a direction parallel to its optical axis. To drive movement, the two halves of the drive member (fixed and moving portions) are displaced relative to one another orthogonally to the plane of the MEMS structure (i.e. parallel to the optical axis of the lens). Displacement is achieved when the lens is inserted into the MEMS structure.

Representatively, the MEMS structure may include a plurality of deflection beams that extend from an outer portion of the MEMS structure radially inward to a lens holder. The deflection beams may be arranged in a planar configuration (e.g., within the plane of the MEMS structure) and with some degree of rotational symmetry about the lens holder. The act of inserting the lens within the lens holder applies an outward force on the deflection beams. In-plane loading of the beams in this manner, causes the beams to snap out of the MEMS structure plane. This in turn displaces a moving portion of the drive member from its fixed portion in a direction parallel to the optical axis. The actuator is considered to be in a non-actuated or steady-state configuration when the deflection beams are deflected so that the two halves of the drive member are displaced relative to each other along the optical axis. Application of a voltage to the drive member will draw the drive member movable portion toward the fixed portion, which in turn causes movement of the associated lens member in a direction parallel to the optical axis to a desired focal position.

The MEMS structure may further include stationary beams and/or resilient members between the movable and/or stationary portions in order to prevent in-plane or lateral movement of the drive member portions and the lens holder.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description.

Figure 1:
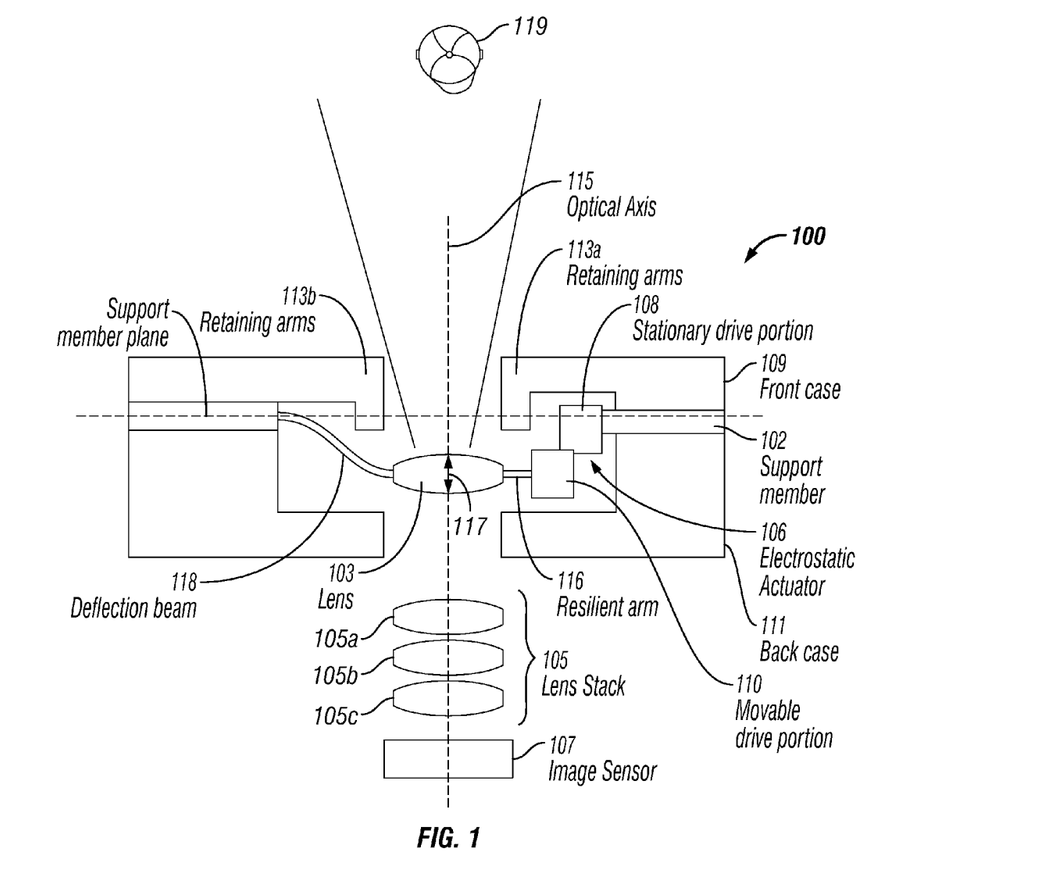
FIG. 1 is a side cross-sectional view of one embodiment of an autofocus actuator positioned within a mounting case.

FIG. 1 is a cross-sectional view of one embodiment of an autofocus actuator. Autofocus actuator 100 may be used to drive movement of a lens element within a camera, for example a miniature camera, integrated within an electronic device. In one embodiment, the electronic device may be a mobile device including, but not limited to, a mobile phone such as a smart phone, a tablet computer, a laptop computer or the like. Autofocus actuator 100 may include a support or base member 102 for supporting each of the components of the autofocus actuator. In one embodiment, support member 102 may be a MEMS autofocus actuator formed from a substantially planar silicon wafer. Representatively, the silicon wafer may undergo various etching and deposition processes to produce each of the associated components that will be described in more detail below. In this aspect, the autofocus actuator 100, including its stationary and movable components, may be one integrally formed structure that is formed as a single unit thus reducing manufacturing time and costs. The silicon wafer may also be fabricated so that support member 102 includes metallic electrode layers to route electrical connections between various contact points along or within support member 102.

Support member 102 may have any size and dimensions suitable for supporting the autofocus actuator components within a camera, particularly a miniature camera mounted within a mobile device. It is further to be understood that the size of support member 102 may be scaled to accommodate a desired application. In one embodiment, support member 102 may be mounted within the desired device, for example a miniature camera, by mounting front case 109 and/or back case 111 surrounding support member 102 within the camera module. It is recognized, however, that front case 109 and/or back case 111 may be optional, and omitted in some embodiments, in which case, support member 102 may be directly mounted within the camera module.

Lens element 103 may be suspended within support member 102 between deflection beam 118 and a resilient arm 116 attached to electrostatic actuator 106. Deflection beam 118, resilient arm 116 and electrostatic actuator 106 may movably mount lens element 103 with respect to support member 102 such that it can move in a direction parallel to its optical axis 115. In other words, lens element 103 moves in a direction normal to the plane of support member 102.

In one embodiment, lens element 103 is a single lens element of a lens stack that is mounted within a camera. Representatively, as illustrated in FIG. 1, lens element 103 is mounted within autofocus actuator 100. Lens stack 105, which includes lens elements 105A, 105B and 105C, and image sensor 107 are mounted behind lens element 103. The object of interest 119 is positioned in front of lens element 103. According to this arrangement, when lens element 103 is in the resting position, it is at a focal position of maximum focus distance, i.e., a position for focus at infinity. Thus, adjusting lens element 103 in a direction of arrow 117 moves lens element 103 closer to the object of interest and decreases the focus distance so that the associated camera can focus on objects, which are outside of the focus distance when lens element 103 is in the resting state. This second focal position can be any focal position other than the focal position for focus at infinity. Representatively, when power is applied to actuator 100, lens element 103 moves in a direction of arrow 117 to any number of focal positions within the range of movement. The range of movement is preferably any range which ensures that deflection beam 118 remains in a deflected or biased position. For example, the range of movement may be between the resting focal position illustrated in FIG. 1 (see also FIG. 2A) and the plane of support member 102.

Movement of lens element 103 may be driven by electrostatic actuator 106. In one embodiment, electrostatic actuator 106 may be a comb drive having a stationary drive portion 108 and a movable drive portion 110. Stationary drive portion 108 and movable drive portion 110 may include fingers, as will be described in more detail in reference to, for example FIG. 3, which interlock with one another to drive movement of stationary drive portion 108 with respect to movable drive portion 110. Representatively, in one embodiment, stationary drive portion 108 is mounted to support member 102 while movable drive portion 110 is suspended in front of stationary drive portion 108 such that the application of a voltage moves movable drive portion 110 in a direction of arrow 117 while stationary drive portion remains stationary.

To move movable drive portion 110 in the desired direction when a voltage is applied, movable drive portion 110 must be displaced with respect to stationary drive portion 108 in the resting or non-actuated state as illustrated by FIG. 1 such that application of pulls movable drive portion 110 toward stationary drive portion 108. Displacement of movable drive portion 110 with respect to stationary drive portion 108 is achieved by deflection beam 118. In particular, in one embodiment, deflection beam 118 is an elongated structure that extends radially inward from support member 102 to lens element 103. Deflection beam 118 may frictionally engage with the edge of lens element 103 such that when lens element 103 is loaded into support member 102 in a downward direction (i.e., toward lens stack 105), lens element 103 applies an outward force to deflection beam 118. In one embodiment, the force moves deflection beam 118 radially outwards. Since this force is in turn applied along a length of deflection beam 118, the beam becomes unstable and buckles. This creates a bi-stable configuration in which the beam snaps out of plane, notionally in either direction. The direction of deflection may be controlled by the direction of insertion of the lens element. In this case, the deflection beam 118 buckles in a downward direction, which in turn displaces movable drive portion 110 below stationary drive portion 108. Movable drive portion 110, and in turn lens element 103, will remain in this position until a voltage sufficient to overcome the downward force of deflection beam 118 and pull movable drive portion 110 toward stationary drive portion 108 is applied.

It is important that deflection beam 118 remain in some degree of the buckled configuration during operation. To maintain the buckled configuration, the range of movement of lens element 103 may be limited using any suitable limiting structure or system. For example, in one embodiment, front case 109 having retaining arms 113A, 113B is positioned along the front face of support member 102. Retaining arms 113A, 113B are positioned above resilient arm 116 and deflection beam 118 and extend down into the plane of support member. Retaining arms 113A, 113B are dimensioned to contact and stop deflection beam 118 and resilient arm 116 from passing above the support member plane as movable drive portion 110 drives lens element 103 in a direction of arrow 117. This in turn, limits the movement of lens element 103 to just below the plane of support member 102. A back case 111 may further be attached to a bottom face of support member 102 such that actuator 100 is enclosed within front case 109 and back case 111.

It is contemplated that any other suitable structure or system may be implemented to limit the range of movement of lens element 103 so that deflection beam 118 remains in a deflected state which is below the plane of support member 102. For example, a single retaining arm that limits movement of movable drive portion 110 may be used. Alternatively, the voltage applied to actuator 100 may be controlled so as not to raise deflection beam 118 beyond the desired deflected position.

Although FIG. 1 illustrates lens 103 in a focal position for focus at infinity in the resting or non-actuated state, it is further contemplated that actuation of autofocus actuator 100 may be required to position lens element 103 in the focus at infinity focal position. Representatively, the deflection beam 118 may be deflected in an opposite direction to that shown in FIG. 1. Thus, in the resting or non-actuated state, deflection beam 118 may be deflected in a direction toward the object of interest 119. To move lens element 103 away from the object of interest 119, i.e., toward the focal position for focus at infinity illustrated in FIG. 1, actuator must be actuated by applying a voltage.

Figure 2A:
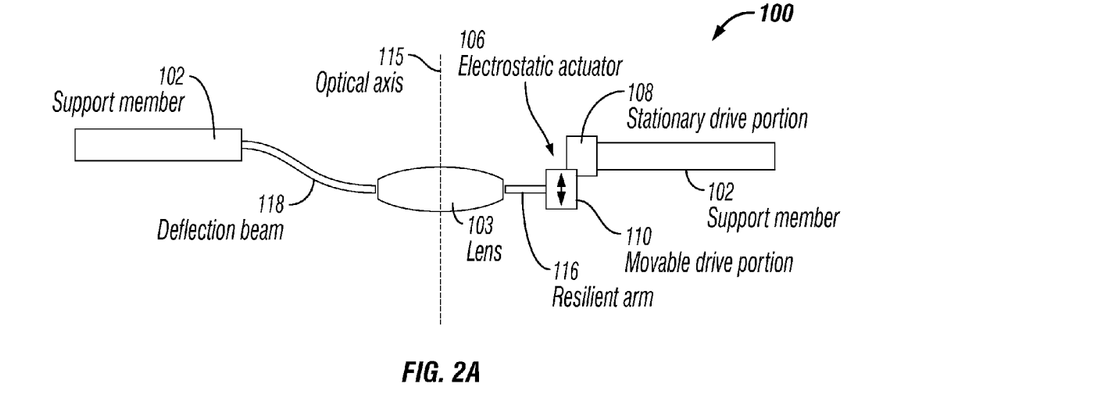
FIG. 2A is a side cross-sectional view of one embodiment of an autofocus actuator in a non-actuated state.
Figure 2B:
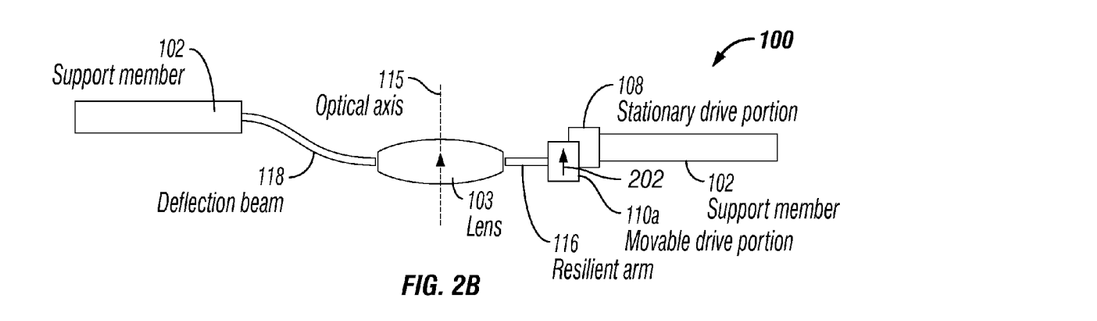
FIG. 2B is a side cross-sectional view of one embodiment of an autofocus actuator in an actuated state.
Figure 2C:
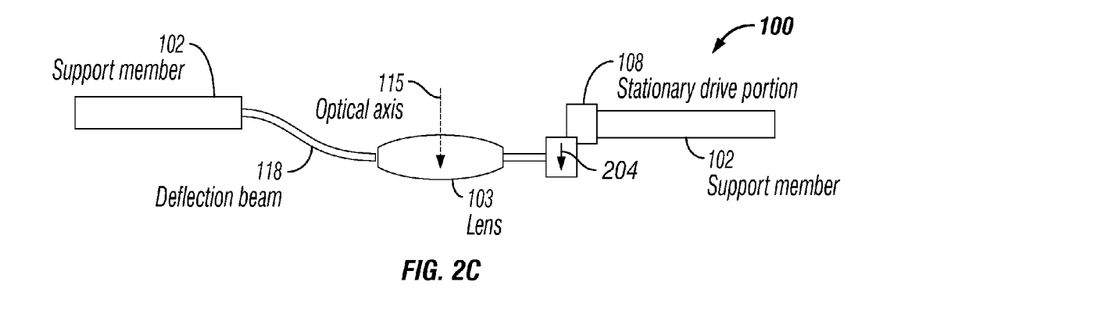
FIG. 2C is a side cross-sectional view of one embodiment of an autofocus actuator in the non-actuated state.

FIGS. 2A-2C illustrate the autofocus actuator of FIG. 1 during operation. In FIG. 2A, autofocus actuator 100 is in the resting or non-actuated state. Deflection beam 118 is therefore in the buckled or deflected configuration and pulls lens element 103 out-of-plane. This in turn, causes movable drive portion 110 to become displaced in a direction parallel to optical axis 115 such that it is below stationary drive portion 108. Lens element 103 remains in this position until a voltage or power is supplied to electrostatic actuator 106.

Once a voltage is applied, attractive electrostatic forces are created between movable drive portion 110 and stationary drive portion 108 causing them to be drawn together. It is noted that a voltage, which creates electrostatic forces greater than the downward deflection forces applied by deflection beam 118, should be used. The voltage may be an alternating current (AC) or direct current (DC). Since stationary drive portion 108 is fixedly attached to support member 102, movable drive portion 110 is drawn in an upward direction along arrow 202 toward support member 102. This, in turn, moves lens element 103 upward toward the plane of support member 102 as illustrated in FIG. 2B. Movement of lens element 103 in the direction of arrow 202 can be controlled by controlling the driving voltage. Representatively, metallic electrode layers formed in support member 102 may form metallic traces, which route electrical connections between electrostatic actuator 106 and a power source (e.g., a battery). A driving voltage may be transmitted from the power source to actuator 106 to actuate actuator 100. Actuator 100 is considered to be in an actuated state when the driving voltage is applied.

Once the voltage is removed, movable drive portion 110 is no longer attracted to stationary drive portion 108. The biasing downward force of deflection beam 118 therefore pulls movable drive portion 110 in a downward direction of arrow 204 and, in turn, lens element 103 back to the resting or non-actuated position as illustrated in FIG. 2C.

Figure 3:
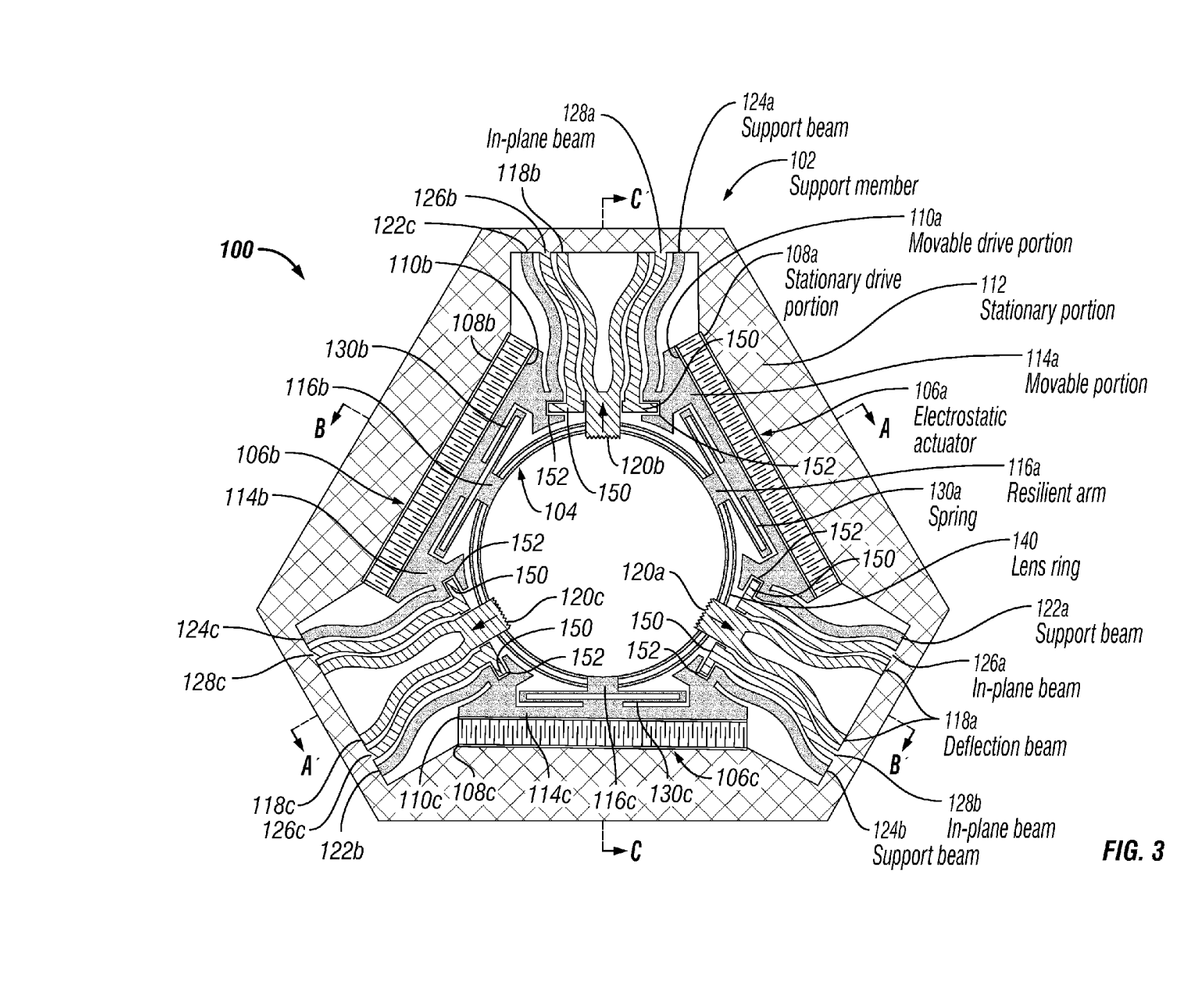
FIG. 3 is a top plan view of one embodiment of an autofocus actuator.

With the above-discussed general operation of autofocus actuator 100 in mind, specific details of each of the above-described actuating components and their operation will now be described in reference to FIG. 3 to FIG. 5. FIG. 3 is a top plan view of one embodiment of an autofocus actuator such as that generally described in reference to FIG. 1. Representatively, FIG. 1 may be understood as generally illustrating a cross-sectional side view of autofocus actuator 100 of FIG. 3 along line A-A'. It is noted that autofocus actuator 100 is substantially symmetrical about any of lines A-A', B-B' or C-C' illustrated in FIG. 3 therefore a similar configuration and operation as described in reference to FIG. 1 applies to any of the other components illustrated along lines B-B' and C-C' of FIG. 3.

As previously discussed, autofocus actuator 100 may be used to drive movement of a lens element within a camera, for example a miniature camera, integrated within an electronic device. Autofocus actuator 100 may include a support or base member 102 for supporting each of the components of the autofocus actuator. In one embodiment, support member 102 may be a micro-electro mechanical systems (MEMS) autofocus actuator formed from a substantially planar silicon wafer. The silicon wafer may also be fabricated so that support member 102 includes metallic electrode layers to route electrical connections between various contact points along or within support member 102.

Support member 102 may have any size and dimensions suitable for supporting the autofocus actuator components within a camera, particularly a miniature camera mounted within a mobile device. Representatively, in one embodiment, support member 102 has a hexagon like shape with a width of from about 3 mm to about 6 mm and a thickness of from about 10 microns to about 14 microns, for example 12 microns. Other sizes and shapes, however, are contemplated, for example support member 102 may alternatively have a square, circular, triangular or rectangular shape depending upon the dimensions of the miniature camera. It is further to be understood that the size of support member 102 may be scaled to accommodate a desired application.

A lens holder 104 dimensioned to hold a lens element is movably mounted within an opening formed in the center of support member 102. Lens holder 104 is movably mounted such that it can move in a direction parallel to an optical axis of the lens element positioned therein. In other words, lens holder 104 moves in a direction normal to the plane of support member 102. In one embodiment, lens holder 104 includes a lens ring 140 dimensioned to encircle a lens element.

Lens ring 140 may be a substantially circular structure dimensioned to receive a similarly shaped lens element. Representatively, in one embodiment, lens ring 140 may be formed by two concentric rings connected together at one or more points around the ring. A recess may be formed around the annular inner surface of the inner ring such that the lens element can be press-fit within the lens ring 140.

Lens ring 140 can be moved in a direction parallel to the optical axis of the lens element mounted therein to focus the lens element using one or more actuators, for example, electrostatic actuators 106A, 106B and 106C. Although three electrostatic actuators 106A, 106B and 106C are illustrated, it is contemplated that less than three or more than three actuators may be attached to lens ring 140. In particular, any number of electrostatic actuators capable of being separately controlled and simultaneously moving a lens element in a direction parallel to an optical axis may be used. In addition, it is preferred that the electrostatic actuators be capable of compensating for any misalignment of the lens element, e.g., lens tilt. In this aspect, electrostatic actuators 106A, 106B and 106C may be evenly spaced around lens ring 140 so that the planar orientation of lens ring 140 is maintained (i.e., does not tilt) as it moves along the optical axis. Alternatively, in other embodiments where tilting of the lens element within lens ring 140 is desirable, electrostatic actuators 106A, 106B and 106C may be positioned such that actuation of one or more of the actuators can be used to tilt the lens element to a desired degree. Movement of electrostatic actuators 106A, 106B and 106C may be controlled by applying a same voltage simultaneously to each of the actuators or separately applying the same or different voltage to each, depending upon the desired degree of movement. Representatively, during an autofocus operation in which an even movement of the lens element in a direction parallel to the optical axis is desired, a same voltage may be applied simultaneously to each of actuators 106A, 106B and 106C. Where it is desired to tilt the lens element, different voltages may be applied to one or more of actuators 106A, 106B and 106C, or a voltage may be applied to one and not to another. In this aspect, it is to be understood that one or more of actuators 106A, 106B and 106C may be separately and independently controlled from another.

Electrostatic actuators 106A, 106B and 106C may be any type of electrostatic actuator capable of driving movement of lens ring 140 along the optical axis of a lens element positioned therein. In one embodiment, electrostatic actuators 106A, 106B and 106C are comb drives that include a stationary drive portion and a movable drive portion. More specifically, electrostatic actuator 106A includes stationary drive portion 108A and the movable drive portion 110A. Stationary drive portion 108A and movable drive portion 110A are capable of moving relative to one another. Although the following discussion will focus on the operation of electrostatic actuator 106A, it is to be recognized that electrostatic actuators 106B and 106C are substantially similar to electrostatic actuator 106A. Therefore the operations of stationary drive portion 108B and movable drive portion 110E of electrostatic actuator 106B and stationary drive portion 108C and movable drive portion 110C of electrostatic actuator 106C, are substantially the same as that described in reference to actuator 106A.

Representatively, in one embodiment, the stationary drive portion 108A is fixedly mounted (e.g. bonded) to a stationary portion 112 of support member 102. An opening may be formed within a center of stationary portion 112 for receiving stationary drive portion 108A. Stationary drive portion 108A may be mounted within the opening so that it is substantially within the plane of support member 102 and stationary portion 112.

Movable drive portion 110A may be mounted to a movable portion 114A of support member 102 that extends in front of stationary drive portion 108A. Movable portion 114A is suspended in front of stationary drive portion 108A by support beams 122A and 124A. Similarly, movable drive portion 110E may be suspended in front of stationary drive portion 108B by support beam 122B and support beam 124B. Movable drive portion 110C may be suspended in front of stationary drive portion 108C by support beam 122C and support beam 124C. Support beams 122B, 124B, 122C and 124C are substantially similar to support beams 122A and 124A therefore the description provided herein with respect to support beams 122A and 124A applies to support beams 122B, 124B, 122C and 124C.

Support beams 122A and 124A extend from stationary portion 112 of support member 102 to opposing sides of movable portion 114A. Movable drive portion 110A is therefore positioned in front of stationary drive portion 108A and is movable with respect to stationary drive portion 108A.

Although in the illustrated embodiment, movable drive portion 110A moves while stationary drive portion 108A remains stationary, other configurations are contemplated. For example, relative movement between movable drive portion 110A and stationary drive portion 108A may include movement of stationary drive portion 108A while movable drive portion 110A remains fixed.

Movable drive portion 110A is attached to lens ring 140 of lens holder 104 by resilient arm 116A. Resilient arm member 116A absorbs movement of lens ring 140 in a direction perpendicular to the optical axis (i.e., in-plane movement) in order to prevent in-plane misalignment of movable drive portion 110A with respect to stationary drive portion 108A. Movement of movable drive portion 110A in a direction parallel to the optical axis moves lens ring 140 in a direction parallel to the optical axis of the lens element mounted within lens holder 104. Movement of the lens element along the optical axis allows for focusing of the lens element at different positions. In order to drive movement of movable drive portion 110A in a direction parallel to the optical axis, movable drive portion 110A is displaced with respect to stationary drive portion 108A along the optical axis. For example, stationary drive portion 108A is at an in-plane position with respect to support member 102 and movable drive portion 110A is out-of-plane.

Autofocus actuator 100 therefore also includes deflection beam 118A attached to lens holder 104 to bias lens holder 104, and in turn movable drive portion 110A, in an out-of-plane position in the non-actuated state. In other words, in the non-actuated state, movable drive portion 110A and stationary drive portion 108A are displaced relative to each other along the optical axis. The term non-actuated state is meant to refer to a resting state of electrostatic actuator 106A in which no power or voltage is being supplied. When a voltage is applied to electrostatic actuator 106A, movable drive portion 110A is drawn toward stationary drive portion 108A. This in turn moves lens holder 104 along the optical axis. The voltage may be an alternating current (AC) or direct current (DC).

Deflection beam 118A is an elongated structure that extends from stationary portion 112 of support member 102 to lens ring 140. Additional deflection beams 118B and 118C may also extend from stationary portion 112 to lens ring 140. Deflection beams 118A, 118B and 118C may be evenly spaced around lens ring 140 such they provide a symmetrical force around lens ring 140. Although three deflection beams 118A, 118B and 118C are illustrated, any number of beams capable of symmetrically balancing a radial load and deflection out-of-plane are contemplated. For example, four or more deflection beams evenly spaced around lens ring 140 may be used.

Each of deflection beams 118A, 118B and 118C may include support ends 120A, 120B and 120C which extend radially inward within lens ring 140. Support ends 120A, 120B and 120C are dimensioned to frictionally engage and suspend a lens element positioned within lens ring 140. In one embodiment, support ends 120A, 120B and 120C may include a serrated surface to enhance the engagement between support ends 120A, 120B and 120C and the associated lens. It is contemplated, however, that other engagement enhancing features or structures may be formed at support ends 120A, 120B and 120C. For example, knobs or a gripping or adhesive type material may be formed at support ends 120A, 120B and 120C.

Support ends 120A, 120B and 120C may be dimensioned to define an annular space within lens ring 140 having a diameter slightly less than the diameter of the lens element. Thus, inserting the lens element within lens ring 140 applies an outward force to support ends 120A, 120B and 120C. In one embodiment, the force moves the support ends 120A, 120B and 120C radially outwards about 15 microns to about 25 microns, for example, about 20 microns. Since this force is in turn applied along a length of deflection beams 118A, 118B and 118C, the beams become unstable and buckle. Since deflection beams 118A, 118B and 118C are arranged in a planar configuration, which has some degree of rotational symmetry, and the beams are loaded in the plane of support member 102, a bi-stable configuration is created in which the beams can snap out of plane, notionally in either direction. The direction of deflection may be controlled by the insertion of the lens element as will be described in more detail in reference to FIG. 5.

Figure 5:
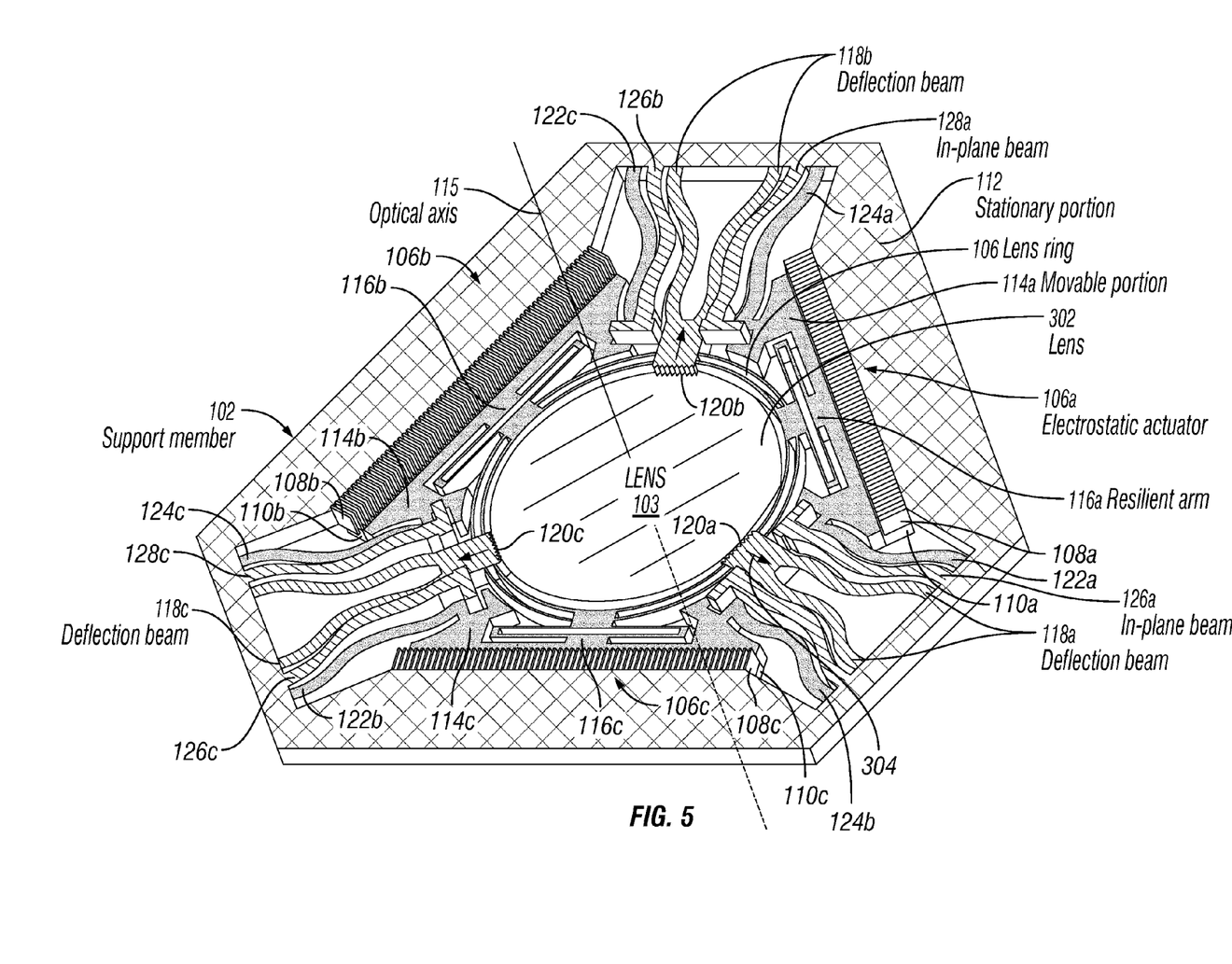
FIG. 5 is a perspective view of the autofocus actuator of FIG. 1.

Representatively, once the lens element is assembled as illustrated in FIG. 5, the steady-state configuration of autofocus actuator 100 is with deflection beams 118A, 118B and 118C deflected or biased so that the movable drive portion 110A and the stationary drive portion 108A are displaced relative to each other along the optical axis 115. This approach greatly simplifies the structure and assembly process of autofocus actuator 100. In so doing, it also allows the MEMS structure to be designed to isolate the MEMS functions more effectively, and allows beams 118A, 118B and 118C to be designed to appropriately survive the drop test.

Each of the movable beams, namely deflection beams 118A, 118B and 118C; and support beams 122A, 122B, 122C, 124A, 124B, 124C, may have a similar shape and dimensions. The shape and dimensions may be any shape and dimensions sufficient to allow the movable beams to flex, bend or deflect out-of-plane as previously discussed while still remaining substantially rigid to in-plane or lateral movements. In this aspect, each of deflection beams 118A, 118B and 118C; and support beams 122A, 122B, 122C, 124A, 124B, 124C can have an in-plane shape which includes one or more (e.g., three), alternatively curved regions disposed along its length. The curvature helps to minimize in-plane or lateral bending along the beam while still allowing the beam to respond to any minimal in-plane forces elastically, as opposed to breaking or cracking.

It is further contemplated that since each of the movable beams are fabricated from a silicon wafer as previously discussed, they may have the same thickness as the wafer. Representatively, deflection beams 118A, 118B and 118C; and support beams 122A, 122B, 122C, 124A, 124B, 124C may have a thickness of for example, from about 10 microns to about 14 microns, for example 12 microns. Still further, deflection beams 118A, 118B and 118C; and support beams 122A, 122B, 122C, 124A, 124B, 124C may have a width of from about 50 to about 150 microns, for example, from about 75 microns to about 100 microns and a length of from about 0.5 mm to about 2 mm, for example, from about 0.75 to about 1.75, for example, 1.5 mm or 1.3 mm. Each of deflection beams 118A, 118B and 118C; and support beams 122A, 122B, 122C, 124A, 124B, 124C may have the same shape and dimensions, or alternatively, one or more of these structures may have a different shape and/or dimensions from the other.

In the illustrated embodiment, deflection beams 118A, 118B and 118C have a forked configuration with each of the fork legs having the above-described curvatures and dimensions.

It is further noted that although support beams 122A, 122B, 122C, 124A, 124B and 124C have similar dimensions to deflection beams 118A, 118B and 118C, they are not loaded in-plane to any significant degree. Support beams 122A, 122B, 122C, 124A, 124B and 124C are also configured such that they do not substantially reduce the out-of-plane deflection of deflection beams 118A, 118B and 118C (which are loaded in-plane). Also, the in-plane movement of deflection beams 118A, 118B and 118C does not substantially affect in-plane movement of support beams 122A, 122B, 122C, 124A, 124B and 124C. Thus, undesirable in-plane movement of deflection beams 118A, 118B and 118C will not cause misalignment of movable drive portions 110A, 110B and 110C connected to their respective support beams.

Autofocus actuator 100 further includes in-plane beams 126A and 128A, which serve to minimize lateral or in-plane movement of the movable components (e.g., deflection beams 118A, 118B, 118C, movable drive portions 110A, 110B, 110C and support beams 122A, 122B, 122C, 124A, 124B and 124C). This aspect is particularly important since autofocus actuator 100 may be implemented within a mobile device, which must be operable even after being dropped on a hard surface. In particular, manufacturing specifications require that mobile devices withstand what is commonly referred to as a "drop test." The drop test requires that the mobile device remain operable after being dropped multiple times from a specified distance above a concrete surface. Dropping of the device in this manner subjects the various components within the device to large impact forces. Minimizing the lateral or in-plane movement of the movable components of autofocus actuator 100 using in-plane beams 126A and 128A therefore helps to improve the impact resistance. In-plane beams 126B, 126C, 128B and 128C are substantially similar to in-plane beams 126A and 128A therefore the description of in-plane beams 126A and 128A applies to these beams as well.

In one embodiment, in-plane beams 126A and 128A may be stationary elongated structures that are positioned within a gap formed between support beams 122A, 124A and the nearest deflection beam (e.g., deflection beams 118A or 118B). In-plane beams 126A and 128A may be positioned within the plane of support member 102 and have a width slightly smaller than the gap between the movable components. Since in-plane beams 126A and 128A minimize lateral movement of support beams 122A, 124A they also minimize lateral movement of movable drive portion 110A. In-plane or lateral movement of movable drive portion 110A can cause misalignment between the movable drive portion 110A and stationary drive portion 108A. Such misalignment may prevent proper operation of electrostatic actuator 106A.

In-plane beams 126A, 126B, 126C, 128A, 128B and 128C may have a similar size and shape along their length as deflection beams 118A, 118B and 118C; and support beams 122A, 122B, 122C, 124A, 124B, 124C except that they may include an extension portion 150 dimensioned to be received within a receiving portion 152 of the associated movable portions 114A, 114B, 114C of support member 102. The complimentary configuration of extension portion 150 and receiving portion 152 helps to further limit the in-plane movement of the moving actuator components (e.g., movable drive portions 110A, 110E and 110C).

Figure 4A:
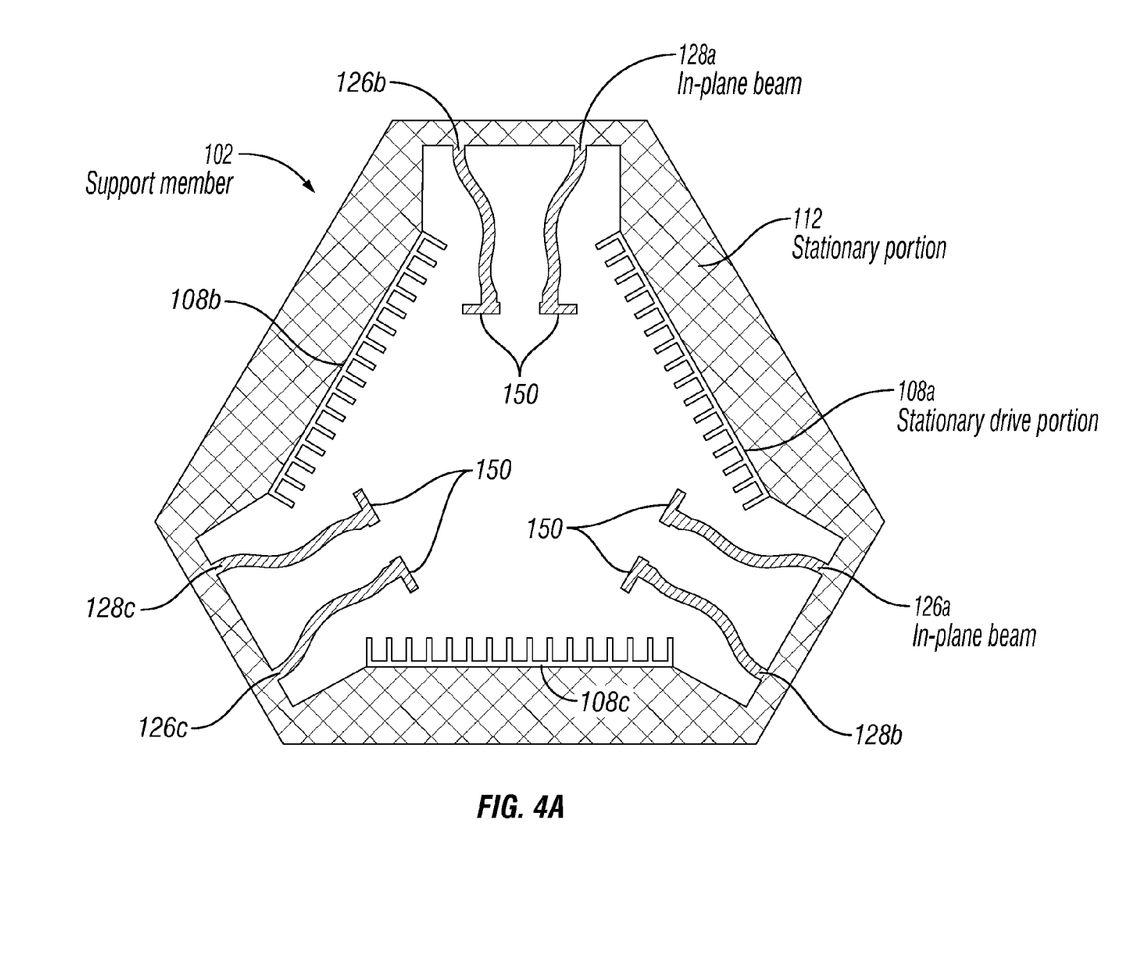
FIG. 4A is an exploded top plan view of the arrangement of the stationary components illustrated in FIG. 3.
Figure 4B:
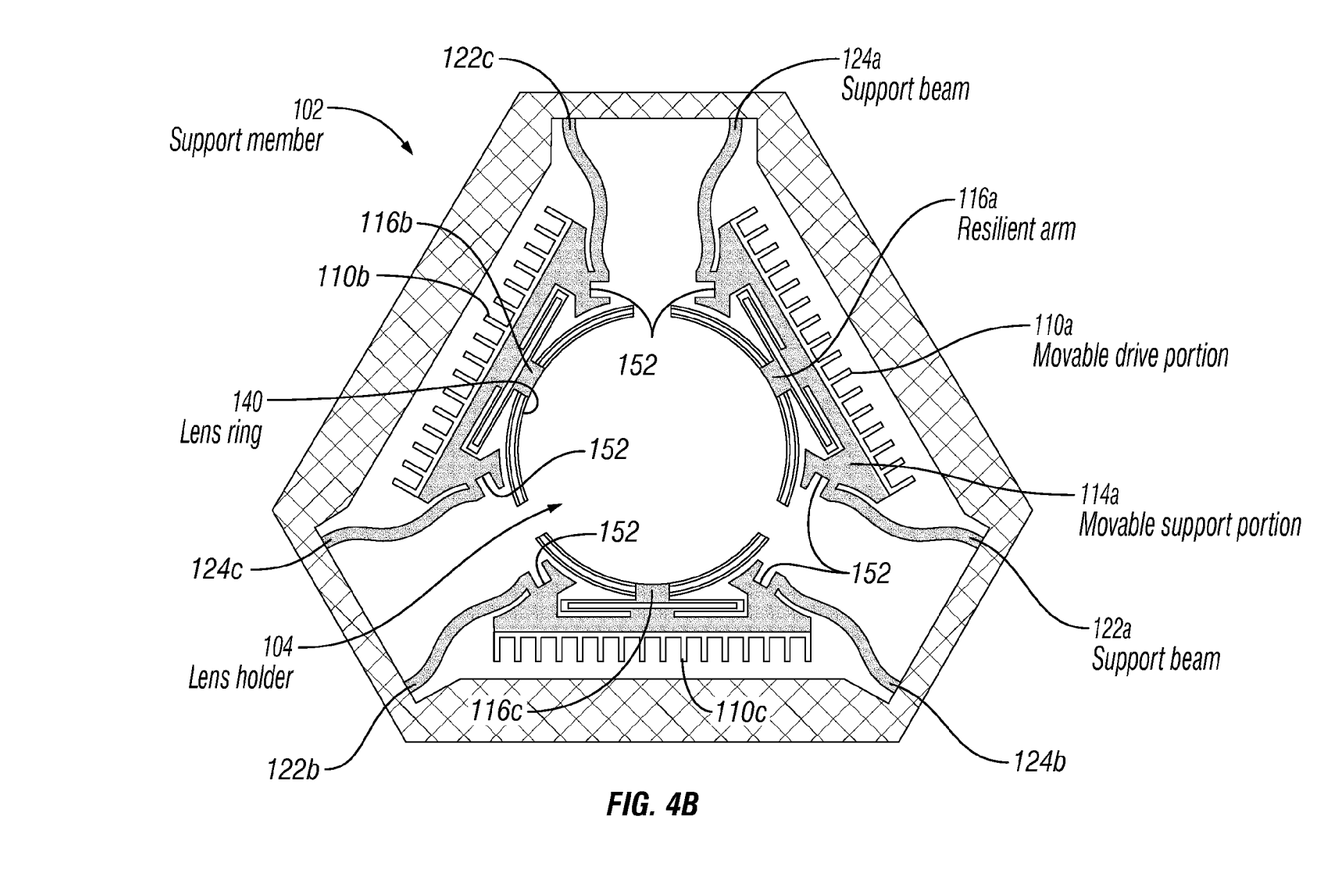
FIG. 4B is an exploded top plan view of the arrangement of the movable components illustrated in FIG. 3.
Figure 4C:
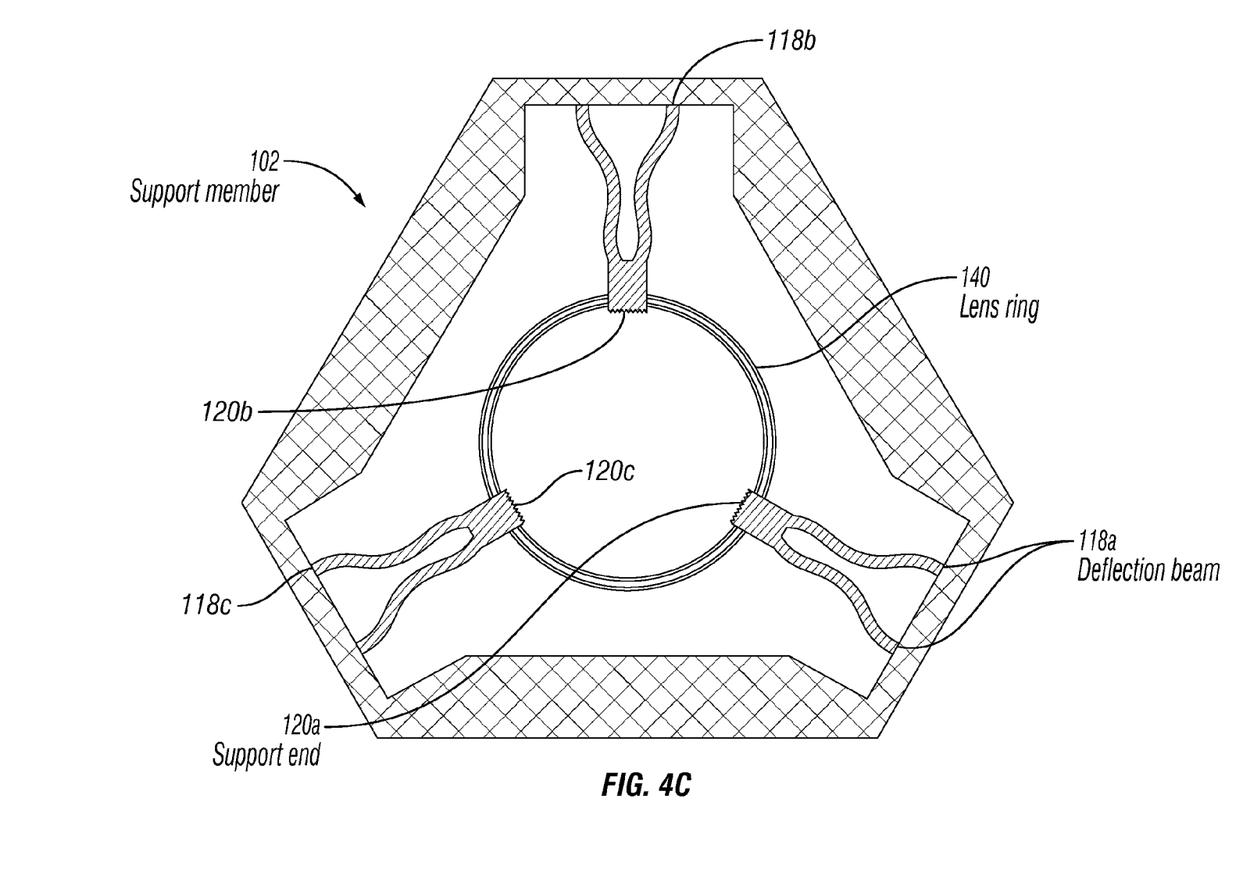
FIG. 4C is an exploded top plan view of the arrangement of the deflection beams illustrated in FIG. 3.

FIGS. 4A-4C provide an exploded top plan view of the arrangement of each of the components discussed in reference to FIG. 3. In particular, FIG. 4A illustrates the stationary components, FIG. 4B illustrates each of the movable components and FIG. 4C illustrates the deflection beams. From this view, it can be understood more clearly, which components move when movable drive portion 110A moves and which components remain stationary. In particular, as can be seen from FIG. 4B, movable drive portion 110A is connected to movable portion 114A, support beams 122A, 124A and lens ring 140. In addition, as can be seem from FIG. 4C, deflection beams 118A are connected to lens ring 140. Thus, movement of movable drive portion 110A also drives movement of each of these components in the same direction. Meanwhile, as can be seem from FIG. 4A, in-plane beams 126A and 128A are independent from the moveable components and attached to stationary portion 112. Thus, in-plane beams 126A and 128A remain stationary when movable drive portion 110A moves.

As previously discussed, loading of a lens element within lens ring 140 applies an outward force to support ends 120A, 120B and 120C causing deflection beams 118A, 118B and 118C to buckle and assume an out-of-plane configuration. This out-of-plane configuration is illustrated in FIG. 5. In particular, as can be seen from FIG. 5, when lens element 103 is loaded into lens ring 140, a force in a direction of arrows 304 is applied to support ends 120A, 120B and 120C causing the associated deflection beams 118A, 118B and 118C to buckle. The buckling of deflection beams 118A, 118B and 118C draws the movable ends attached to lens ring 140 out-of-plane in a direction parallel to the direction in which lens element 103 is loaded into lens ring 140. For example, in this embodiment, lens element 103 is loaded from above and pressed down into lens ring 140. Deflection beams 118A, 118B and 118C will therefore deflect and pull lens ring 140 to a position that is below the plane of support member 102. This position can be considered the resting position of autofocus actuator 100 or position of the actuator in the non-actuated state. In other words, the position of autofocus actuator 100 when power is not being applied.

As can further be seen from this view, when deflection beam 118A deflects, it also pulls movable drive portion 110A down with respect to stationary drive portion 108A. Thus, movable drive portion 110A and stationary drive portion 108A are displaced relative to each other along the optical axis in the non-actuated state. Deflection beams 118B, 118C and their associated drive portions 108B, 110E and 108C, 110C operate in a similar manner.

Since the in-plane beams, for example in-plane beams 126A, 128A and stationary portion 112 are independent from the movable components, these features remain in-plane with respect to support member 102.

It is further noted that in some embodiments, the outward force, illustrated by arrow 304, on lens ring 140 caused by loading of lens element 103 within lens ring, will cause other portions of lens ring 140 to be drawn inward. In particular, the portions of lens ring 140 attached to resilient arms 116A, 116B and 116C may be pulled radially inward to allow the outward force in the direction of arrows 304. Each of resilient arms 116A, 116B and 116C may include spring members 130A, 130B and 130C, respectively. Spring members 130A, 130B and 130C help to maintain in-plane alignment of the electrostatic actuators 106A, 106B and 106C in that they allow resilient arms 116A, 116B and 116C, respectively, to expand in response to the radially inward force without pulling the movable drive portion away from the stationary drive portion.

Figure 6:
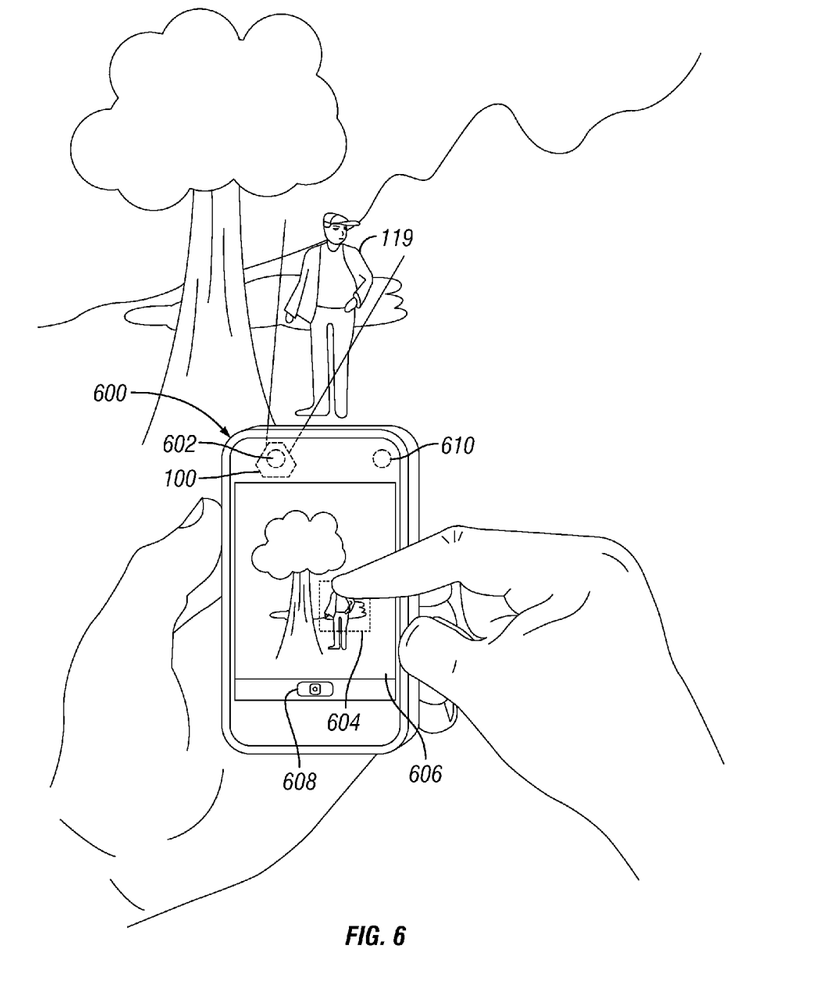
FIG. 6 is a perspective view of one embodiment of an implementation of an autofocus actuator within a mobile device.

FIG. 6 illustrates one implementation of the autofocus actuator described herein. Representatively, autofocus actuator 100 may be mounted within a miniature camera contained within a mobile device 600. Here, the user is making a manual or touch selection on the touch screen viewfinder, which is previewing an object of interest 119, at which the camera lens system 602, having autofocus actuator 100 therein, is aimed. The selection may be in the form of a target graphic 604 such as a contour that may be drawn by the user on the touch screen 606. Alternatively, the selection or target graphic 604 may be a fixed frame or a fixed solid area that moves with the user's finger across the touch screen 606. The autofocus actuator 100 moves lens element 302 mounted therein so that the object of interest 119 is in focus. A flash element 610 may further be provided to illuminate the object of interest 119. Once the user determines that the object of interest 119 is in focus, the user can capture the image by pressing virtual shutter button icon 608.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the autofocus actuator is described as a MEMS device for use in a miniature camera, it is contemplated that the size and dimensions of the autofocus actuator can be scaled to accommodate any size camera or other device requiring movement of a lens or other component similar to that caused by autofocus actuator. Still further, although use of the actuator in a mobile device is disclosed, it is further contemplated that the actuator may be used to drive movement of a lens element within any kind of camera, e.g., still and/or video, integrated within any kind of electronic device or a camera that is not integrated into another device. Representative non-mobile devices may include a desktop computer, a television or the like. In addition, the actuator may be formed from a material other than a silicon wafer, or the different actuator components may be formed from different materials and assembled after formation to form the actuator. The description is thus to be regarded as illustrative instead of limiting.

What is claimed is:
1. A micro-electro-mechanical systems (MEMS) autofocus actuator comprising:
   a support member for supporting a lens element, the support member having a stationary portion and a movable portion, the movable portion attached to the stationary portion by a movable support beam;
   an electrostatic drive member having a first portion attached to the stationary portion and a second portion attached to the movable portion to drive movement of the movable portion with respect to the stationary portion; and
   a lens holder suspended within the support member, the lens holder suspended by a resilient arm member attached to the movable portion and a deflection beam attached to the stationary portion, wherein the deflection beam is dimensioned to deflect when a lens element is inserted within the lens holder so that in a non-actuated state, the lens element is in a first focal position that is substantially out-of-plane with respect to the stationary portion, and in an actuated state, the lens element is in a second focal position, the second focal position being different from the first focal position.

2. The autofocus actuator of claim 1 wherein the electrostatic drive member is one of a plurality of comb drives radially spaced around the lens holder.

3. The autofocus actuator of claim 1 wherein the first focal position is a position for focus at infinity and the second focal position is a position for closer focus.

4. The autofocus actuator of claim 1 wherein the second position is substantially in-plane with respect to the stationary portion.

5. The autofocus actuator of claim 1 wherein the lens holder comprises a ring member dimensioned to encircle the lens element and a radial support member extending into the ring member from the deflection beam to radially suspend the lens element within the ring member.

6. The autofocus actuator of claim 4 wherein the resilient arm member comprises a spring member that expands in response to in-plane movement of the ring member when the lens element is inserted into the ring member to prevent in-plane movement of the electrostatic drive member.

7. The autofocus actuator of claim 1 wherein the lens holder, the resilient arm and the deflection beam are integrally formed as a single unit with the support member from a silicon wafer.

8. The autofocus actuator of claim 1 wherein the deflection beam is one of a plurality of deflection beams radially spaced around the lens holder and wherein each of the plurality of deflection beams is dimensioned to deflect when a lens element is inserted within the lens holder.

9. The autofocus actuator of claim 1 wherein the movable support beam is a first movable support beam, the autofocus actuator further comprising a second movable support beam, the second movable support beam attached to the movable portion at an end opposite the first movable support member so that the second portion of the electrostatic drive member is movably suspended in front of the first portion.

10. The autofocus actuator of claim 1 further comprising: a stationary alignment beam extending from the stationary portion and positioned between the movable support beam and the deflection beam to minimize in-plane movement of the lens holder.

11. The autofocus actuator of claim 1 wherein the autofocus actuator is incorporated into a camera module of a mobile communications device.

12. The autofocus actuator of claim 1 wherein the lens element is a single lens of a lens stack.

13. A micro-electro-mechanical systems (MEMS) autofocus actuator comprising:
an electrostatic drive member having a stationary drive portion and a movable drive portion, the movable drive portion capable of moving with respect to the stationary drive portion, the stationary drive portion mounted to a substantially planar support member such that the stationary drive portion is within a plane of the planar support member and the movable drive portion is capable of moving in a direction normal to the plane;
a lens holder dimensioned to receive a lens element, the lens holder mounted to the movable drive portion such that movement of the movable drive portion drives movement of the lens holder in a direction parallel to an optical axis of the lens element; and
a plurality of deflection beams extending from the planar support member to the lens holder, the plurality of deflection beams dimensioned to frictionally suspend the lens element within the lens holder, wherein the plurality of deflection beams are biased in an out-of-plane position when the lens element is inserted within the lens holder.

14. The autofocus actuator of claim 13 wherein the electrostatic drive member is one of a plurality of comb drives radially spaced around the lens holder.

15. The autofocus actuator of claim 13 wherein the electrostatic drive member is configured to move the lens element in a direction parallel to the optical axis when a voltage is applied to the electrostatic drive member.

16. The autofocus actuator of claim 13 wherein when the deflection beams are biased in the out-of-plane position, the lens element within the lens holder is in a first focal position.

17. The autofocus actuator of claim 16 wherein the lens element is capable of moving to a second focal position when a voltage is applied to the electrostatic drive member, the second focal position different than the first focal position.

18. The autofocus actuator of claim 13 further comprising:
an in-plane stationary member dimensioned to minimize lateral movement of the lens element.

19. An autofocus actuator comprising:
a plurality of drive members mounted within an opening of a substantially planar support member, each of the drive members having a stationary drive portion and a movable drive portion, the movable drive portion capable of moving with respect to the stationary drive portion, and wherein the stationary drive portion is within a plane of the planar support member and the movable drive portion is capable of moving in a direction normal to the plane;
a plurality of deflection beams positioned between the plurality of drive members and extending radially inward of the plurality of drive members to form an annular opening within the support member, the annular opening dimensioned to receive a lens element; and
a lens mounting member having a lens support member dimensioned to encircle a lens element positioned within the annular opening and a plurality of resilient arm members radially spaced around the lens support member and attached to a respective movable drive portion, and wherein the plurality of deflection beams and the movable drive portion are biased in an out-of-plane position when the lens element is inserted within the annular opening.

20. The actuator of claim 19 wherein the lens element is in a first position when the movable drive portion is in the out-of-plane position, and when a voltage is applied to the plurality of drive members, the movable drive portion moves the lens element to a second different position.

21. The actuator of claim 19 wherein each of the plurality of deflection beams have alternatively curved regions disposed along their length to help minimize in-plane bending along the beams.

* * * * *